(12) United States Patent
In et al.

(10) Patent No.: US 7,777,535 B1
(45) Date of Patent: Aug. 17, 2010

(54) COUPLED NONLINEAR ELEMENTS FOR FREQUENCY DOWN-CONVERSION SYSTEMS AND METHODS

(75) Inventors: Visarath In, Chula Vista, CA (US); Patrick Longhini, San Diego, CA (US); Yong (Andy) An Kho, Chula Vista, CA (US); Joseph D. Neff, San Diego, CA (US); Adi R. Bulsara, San Diego, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 162 days.

(21) Appl. No.: 12/125,397

(22) Filed: May 22, 2008

(51) Int. Cl.
*H03B 19/00* (2006.01)
(52) U.S. Cl. .................. 327/117; 327/113
(58) Field of Classification Search .............. 327/113, 327/117
See application file for complete search history.

(56) References Cited

U.S. PATENT DOCUMENTS

| | | | |
|---|---|---|---|
| 5,509,040 A * | 4/1996 | Shimada | 377/117 |
| 5,528,445 A | 6/1996 | Cooke et al. | |
| 6,008,642 A | 12/1999 | Bulsara et al. | |
| 6,020,782 A | 2/2000 | Albert et al. | |
| 6,822,522 B1 | 11/2004 | Brown et al. | |
| 6,880,400 B1 | 4/2005 | Fogliatti et al. | |
| 7,196,590 B1 * | 3/2007 | In et al. | 331/53 |
| 2007/0001719 A1 * | 1/2007 | Hulfachor et al. | 327/117 |
| 2007/0057186 A1 | 3/2007 | Nakasuji et al. | |
| 2008/0258780 A1 * | 10/2008 | Wood | 327/117 |

OTHER PUBLICATIONS

Visarath In et al.; Complex Dynamics in Unidirectionally Coupled Overdamped Bistable Systems Subject to a Time-Periodic External Signal; Physical Review E 72, 045104(R), 2005.
Patrick Longhini, Antonio Palacios, Visarath In, Joseph D. Neff, Andy Kho, and Adi Bulsara; Exploiting dynamical symmetry in coupled nonlinear elements for efficient frequency down-conversion; Phys. Rev. E 76, 026201 (2007)—Published Aug. 1, 2007.
Non-Published U.S. Appl. No. 11/755,601, filed May 30, 2007, titled "Wideband Nonlinear "Channelizer" for Rapid Processing of Static and Time-Varying Signals".
A. Bulsara, V. In, A. Kho, P. Longhini, A. Palacios, W-J. Rappel, J. Acebron, S. Baglio, and B. Ando. Emergent oscillations in unidirectionally coupled overdamped bistable systems. Phys. Rev. E 70, 036103-1-12 (2004).
V. In, A. Bulsara, A. Palacios, P. Longhini, A. Kho, and J. Neff. Coupling-induced oscillations in overdamped bistable systems. Physical Review E 68, Rapid Communication (2003) 045102-1.

(Continued)

*Primary Examiner*—Lincoln Donovan
*Assistant Examiner*—Ryan C Jager
(74) *Attorney, Agent, or Firm*—Kyle Eppele; J. Eric Anderson

(57) ABSTRACT

In various embodiments, an apparatus for down-converting a first signal having a first frequency to a lower frequency is disclosed. The apparatus can include one or more arrays of N over-damped, bi-stable circuits unidirectionally-coupled from element to element.

10 Claims, 8 Drawing Sheets

OTHER PUBLICATIONS

A. Palacios, J. Aven, V. In, P. Longhini, A. Kho, J. Neff, and A. Bulsara. Coupled-core fluxgate magnetometer: Novel configuration scheme and the effects of a noise-contaminated external signal. Physics Letters A 367, 25-34 (2007).

V. In, A. Kho, A. Bulsara, J. Neff, S. Baglio, V. Sacco, A. Palacios, and P. Longhini. Coupling nonlinear sensors for enhanced sensitivity: A prototype using the three coupled-core fluxgate magnetometer. Proceedings of the 4th IEEE Conference on Sensors. Irvine, CA, Mar. 2006 57-60.

A. Palacios, R. Carretero-Gonzalez, P. Longhini, N. Renz, V. In, A. Kho, J. Neff, B. Meadows, and A. Bulsara. Multifrequency synthesis using two coupled nonlinear oscillator arrays. Physical Review E 72, 026211 (2005).

Visarath In, Andy Kho, Joseph D. Neff, Antonio Palacios, Patrick Longhini, and Brian K. Meadows. Experimental Observation of Multifrequency Patterns in Arrays of Coupled Nonlinear Oscillators; Physical Review Letters vol. 91, No. 24. (2003).

Visarath In, Adi Bulsara, Andy Kho, Antonio Palacios, Patrick Longhini, Juan Acebron, Salvatore Aglio and Bruno Ando. Self-Induced Oscillations in Electronically-Coupled Fluxgate Magnetometers; Experimental Chaos: 8th Experimental Chaos Conference. AIP Conference Proceedings, vol. 742, pp. 57-62 (2004).

A. Bulsara, J.F. Lindner, V. In, A. Kho, S. Baglio, V. Sacco, B. Ando, P. Longhini, A. Palacios, and W. J. Rappel. Coupling-Induced cooperative behavior in dynamic ferromagnetic cores in the presence of a noise floor. Physics Letters A 353 4-10 (2006).

V. In, A. Bulsara, A. Kho, A. Palacios, S. Baglio, B. Ando, and V. Sacco. Dynamic cooperative behavior in a coupled-core fluxgate magnetometer. IEEE, ICAS 2006, 0-7-7803-9390-2/06, 5171-5174 (2006).

Visarath In, Andy Kho, Adi R. Bulsara, Joseph D. Neff, Salvatore Baglio, Vincenzo Sacco, Antonio Palacios, and Patrick Longhini. Coupling Nonlinear Sensors for Enhanced Sensitivity: A Prototype Using The 3 Coupled-Core Fluxgate Magnetometer; IEEE 0-7803-9056-3/05; 57-60 (2005).

Visarath In, Andy Kho, Adi .R. Bulsara, Antonio Palacios, Salvatore Baglio, B. Ando, Patrick Longhini, Joseph D. Neff, Brian K. Meadows. Self-Induced Oscillations in Coupled Fluxgate Magnetometer: A Novel Approach to Operating the Magnetic Sensors; IEEE, ICAS 2004, 0-7803-8251-X/04, 736-739 (2004).

Visarath In et al.; Complex Behavior in Driven Unidirectionally Coupled Overdamped Duffing Elements; Physical Review E, 73, 066121, 2006.

* cited by examiner

COUPLED NONLINEAR ELEMENTS FOR FREQUENCY DOWN-CONVERSION SYSTEMS AND METHODS

BACKGROUND

I. Field

This disclosure relates to systems and methods for frequency down-conversion.

II. Background

The conversion of signals from a first (high) frequency to a second (lower) frequency is a fundamental function in many fields of endeavor, such as communications.

Often, frequency down-conversation is accomplished via a process known as heterodyning. Unfortunately, various heterodyning circuits can be inefficient and may raise the noise-floor of those devices implementing the heterodyning circuits. Accordingly, new approaches to frequency down-conversion are desirable.

SUMMARY

Various aspects and embodiments of the invention are described in further detail below.

In a first series of embodiments, an apparatus for down-converting a first signal having a first frequency to a lower frequency is disclosed. The apparatus can include one or more arrays of N over-damped, bi-stable circuits unidirectionally-coupled from element to element.

In another series of embodiments, an apparatus for down-converting a first signal having a first frequency to a lower frequency includes an input signal source and a first means for frequency reduction coupled to the input signal source.

In yet another series of embodiments, a method for down-converting a first signal having a first frequency to a lower frequency includes passing the first signal through a cascade of one or more arrays of unidirectionally coupled over-damped bi-stable elements.

BRIEF DESCRIPTION OF THE DRAWINGS

The features and nature of the present disclosure will become more apparent from the detailed description set forth below when taken in conjunction with the accompanying drawings in which reference characters identify corresponding items.

DETAILED DESCRIPTION

Figure 1:
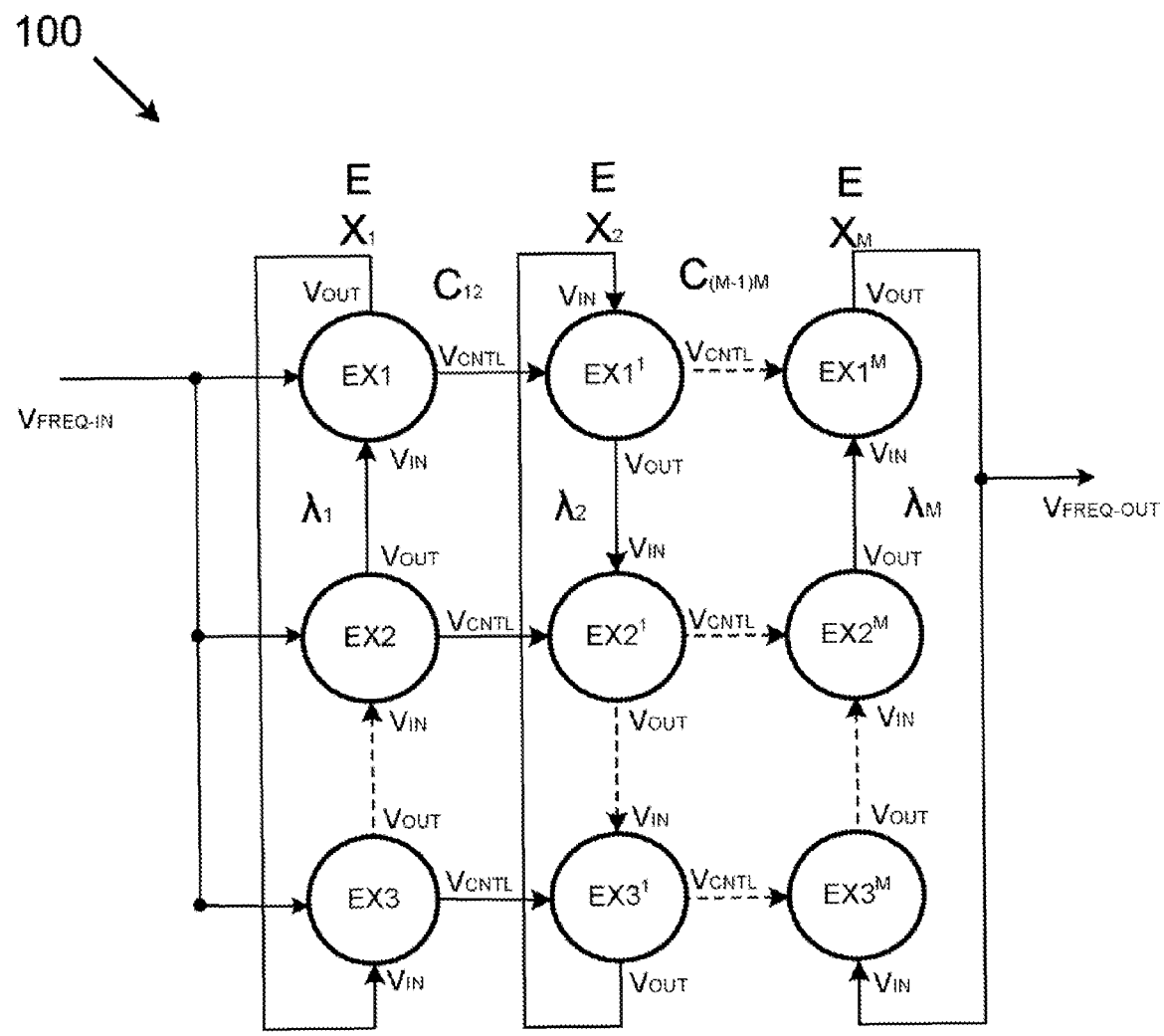
FIG. 1 depicts an exemplary frequency conversion circuit.

The disclosed methods and systems below may be described generally, as well as in terms of specific examples and/or specific embodiments. For instances where references are made to detailed examples and/or embodiments, it should be appreciated that any of the underlying principals described are not to be limited to a single embodiment, but may be expanded for use with any of the other methods and systems described herein as will be understood by one of ordinary skill in the art unless otherwise stated specifically.

This disclosure is in part based upon a model-independent approach that emphasizes the symmetries of a network of coupled devices, such as Duffing elements, to demonstrate the idea that certain frequency down-conversion patterns can be induced by the network topology, i.e., number of elements and type of coupling. The proposed coupling schemes of this disclosure can extend to larger networks where even lower frequency down-conversion ratios can be achieved. Further, the frequency down-conversion approaches described here may have many applications in communication and signal processing where converting a high frequency signal down to a lower frequency is desirable to avoid the limitations (mainly speed) of analog-to-digital converters (ADCs), for example.

The down-conversion effect described herein is direct, very fast, efficient, and can avoid a noise floor that could be introduced by conventional frequency conversion devices, such as a reference generator of a heterodyne circuit. By suitably adjusting a particular array and coupling topologies, the down-conversion ratio in any given application can be readily adjusted to 1-to-m where m is an integer.

As is below shown in this disclosure, a high frequency signal can be down-converted by passing it through an array of unidirectionally coupled over-damped bi-stable elements. Such arrays may be coupled together to produce greater frequency division. The coupling scheme, as well as the choice of element dynamics, are very different from any other known approaches, and thus the underlying mechanism of down-conversion is also significantly different. As an example, the frequency down-conversion can be by a factor of ½, ⅕, or 1/11 for two coupled arrays of three elements (N=3; M=2). A generalization to larger M is also provided below.

For the purpose of the following disclosure, a "cell" can be defined as an individual element, typically represented via the evolution of a state variable: $\dot{x}=f(x; \alpha)$, with the overdot denoting a time derivative and $\alpha \in R_p$ with Rp being a vector of cell parameters. Further, $f:Rn \times Rp$ implies R is a smooth function.

There are inherent properties of the network dynamics that may be restricted by symmetry, including local properties (dictated by individual cell dynamics) and global properties (predicated by the coupling) symmetries. The dynamics of an individual cell in an array can be Eq. 1 below:

$$\dot{x}_i = f(x_i, \alpha) + \Sigma_{j \to i} \lambda_{ij} h(y_j, x_i) \qquad \text{Eq. (1)}$$

where $\dot{x}_i = (x_{i1}, \ldots, x_{ik}) \in R^k$ denotes the state variables of cell EX-i, and the function h defines the coupling (having strength $\lambda_{ij}$) between cells EX-i and EX-j.

We start with a special case of the more general setup by referring to FIG. 1, which depicts a network 100 of M coupled arrays with each array having N elements with dynamics described by:

$$\dot{x}_i = f(x_i, \alpha) + \Sigma_{j \to i} \lambda_{ij} h(y_j, x_i) \qquad \text{Eq. (2)}$$

$$\dot{y}_i = f(y_i, \alpha) + \Sigma_{j \to i} \lambda_{ij} h(y_j, x_i) + c_{ij} k(y_j, x_i) \qquad \text{Eq. (3)}$$

where $\dot{y}_i=(y_{i1}, \ldots, y_{ik}) \in R^k$ denotes the state variables of cell EX-i in the second array, k is an inter-array coupling function, and $c_{ij}$ is the corresponding coupling strength.

Figure 2:
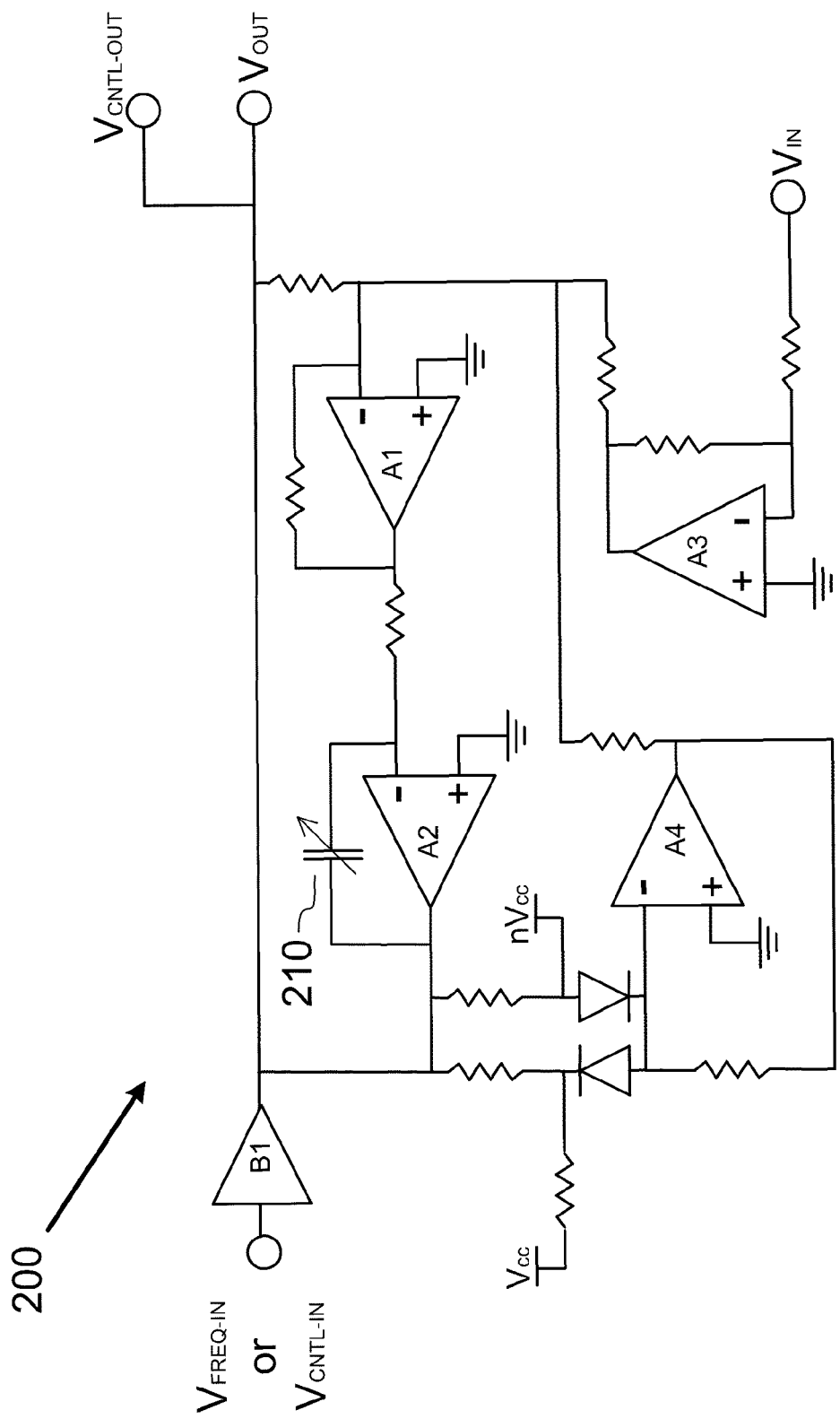
FIG. 2 depicts an exemplary non-linear element of the frequency conversion circuit of FIG. 1.

FIG. 2 depicts an exemplary, non-limiting non-linear element 200 of the frequency conversion circuit of FIG. 1, shown in FIG. 1 as elements $EX_{1-M}$. As shown in FIG. 2, the exemplary non-linear element 200 includes a buffer B1 and a number of amplifiers A1-A4 having various configurations and interconnected via various resistors, diodes and a variable capacitor 210. Note that for elements EX1-EXN in the first array $EX_1$, the input $V_{CNTL-IN}$ would be replaced with $V_{FREQ-IN}$. Note that FIG. 2 represents but one of any number of possible usable oscillator elements having non-linear properties.

Returning to FIG. 1, notice the unidirectional coupling ($V_{IN}$ to $V_{OUT}$) in each array and also between adjacent cells in the two arrays ($V_{CNTL}$ to $V_{OUT}$). The opposite directions of the intra-array couplings should also be noted. The unidirectional inter-array coupling can yield a network with global symmetry described by the direct product of $Z_N \times Z_N$, in which $Z_N$ is the group of cyclic permutations of N objects. Each element of the direct product group permutes each element of the corresponding arrays simultaneously. For the moment, there is no externally applied signal.

To study the patterns of behavior for the M=2 case of the network 100 in FIG. 1, we use $X_1(t) \equiv X(t) = (x_1(t), \ldots, x_N(t))$ to represent the state of one array and $X_2(t) \equiv Y(t) = (y_1(t), \ldots, y_N(t))$ to denote the state of the second array. Thus, at any given time t, a spatio-temporal pattern generated by the network can be described by $P(t)=(X(t), Y(t))$.

To begin the analysis, let us assume that both arrays exhibit a Traveling Wave (TW) pattern with period T. That is, the waveforms produced by each array are identical, but out-of-phase by a constant time lag ø=T/N. We also make a second assumption that the $X_2$ array oscillates at m times the period of the $X_1$ array, where m is a nonzero integer.

Thus, P(t) has the form:

$$P(t)=(x(t), x(t+(N-1)\phi), \ldots, x(t+\phi), y(t), y(t+m\phi), \ldots, y(t+(N-1)m\phi)) \qquad \text{Eq. (4)}$$

Note that where the $X_1$ array exhibits a TW in the opposite direction of the $X_2$ array as a direct result of the opposite orientation of their coupling schemes. For simplicity of explanation, assume that N=3, and that the units are coupled as is shown in FIG. 1. From Eq. (4), a solution to this network has the form:

$$P(t) = \left(x(t), x\left(t+\frac{2T}{3}\right), x\left(t+\frac{T}{3}\right), y(t), y\left(t+\frac{mT}{3}\right), y\left(t+\frac{2mT}{3}\right)\right). \qquad \text{Eq. (5)}$$

Now assume that P(t) has spatio-temporal symmetry described by the cyclic group $\Gamma \equiv Z_3 \times Z_3$ and by the group $S_1$ of temporal shifts. Together, $\Gamma \equiv Z_3 \times Z_3 \times S_1$ acts on P(t) as follows:

First, Γ acts as a permutation:

Γ.

$$P(t) = \left(x\left(t+\frac{T}{3}\right), x(t), x\left(t+\frac{2T}{3}\right), y\left(t+\frac{2mT}{3}\right), y(t), y\left(t+\frac{mT}{3}\right)\right). \qquad \text{Eq. (6)}$$

Then $S_1$ shifts time by mT=3 so that $$\left(\Gamma, \frac{mT}{3}\right) \cdot P(t) = \left(x\left(t+\frac{m+1}{3}T\right), x\left(t+\frac{m}{3}T\right), \right. \qquad \text{Eq. (7)}$$
$$\left. x\left(t+\frac{m+2}{3}T\right), y(t+mT), y\left(t+\frac{m}{3}T\right), y\left(t+\frac{2m}{3}T\right)\right)$$

Since the cells are assumed to be identical, it follows that $\Gamma \equiv Z_3 \times Z_3 \times S_1$ is a spatio-temporal symmetry of the network provided that X(t)=X(t+((m+1)/3)T) and Y(t)=Y(t+mT).

However, given $X_1$ is T-periodic, this implies that m=3k−1, where k is a nonzero integer. As k increases (starting at one) we obtain the following values for m: 2, 5, 8, 11, 14, 17, 20, 23 . . . .

When m=2, for instance, the $X_2$-array oscillates at ½ the frequency of the $X_1$-array. Likewise, m=5 suggests that the $X_2$-array oscillates at ⅕ the frequency of the $X_1$-array. The case when m=8 should be excluded, however, since m=8=$2^2$×2.

Continuing, as N increases, similar frequency down-conversion ratios emerge. A bifurcation analysis shows that the regions of existence of these frequency ratios form a well-defined partition, in parameter space ($\lambda_2$, $c_{xy}$), that is reminiscent of Arnold's tongue structures. In general (noting that N is odd) $\omega x_1/\omega x_2$=N−1, 2N−1, . . . , kN−1.

One would expect that analogous behavior is obtained when the cross-coupling topology is altered, as shown in FIG. 2, for example, the global symmetries of this network are now defined by:

$$\Gamma: (3,2,1,1',2',3') \mapsto (2,1,3,2',3',1'). \qquad \text{Eq. (8)}$$

Repeating a similar analysis (not shown for brevity) leads one to conclude that this latest group of symmetries would force the Y-array to oscillate at (1, 4, 7, . . . , 3k−2) times the period of the X-array in addition to the 1=2 and 1=5 frequency relations of the previous network. Again a well-defined partition associated with the various down-conversion ratios are found, in the parameter space ($\lambda_2$, $c_{xy}$), for larger arrays.

Figure 3:
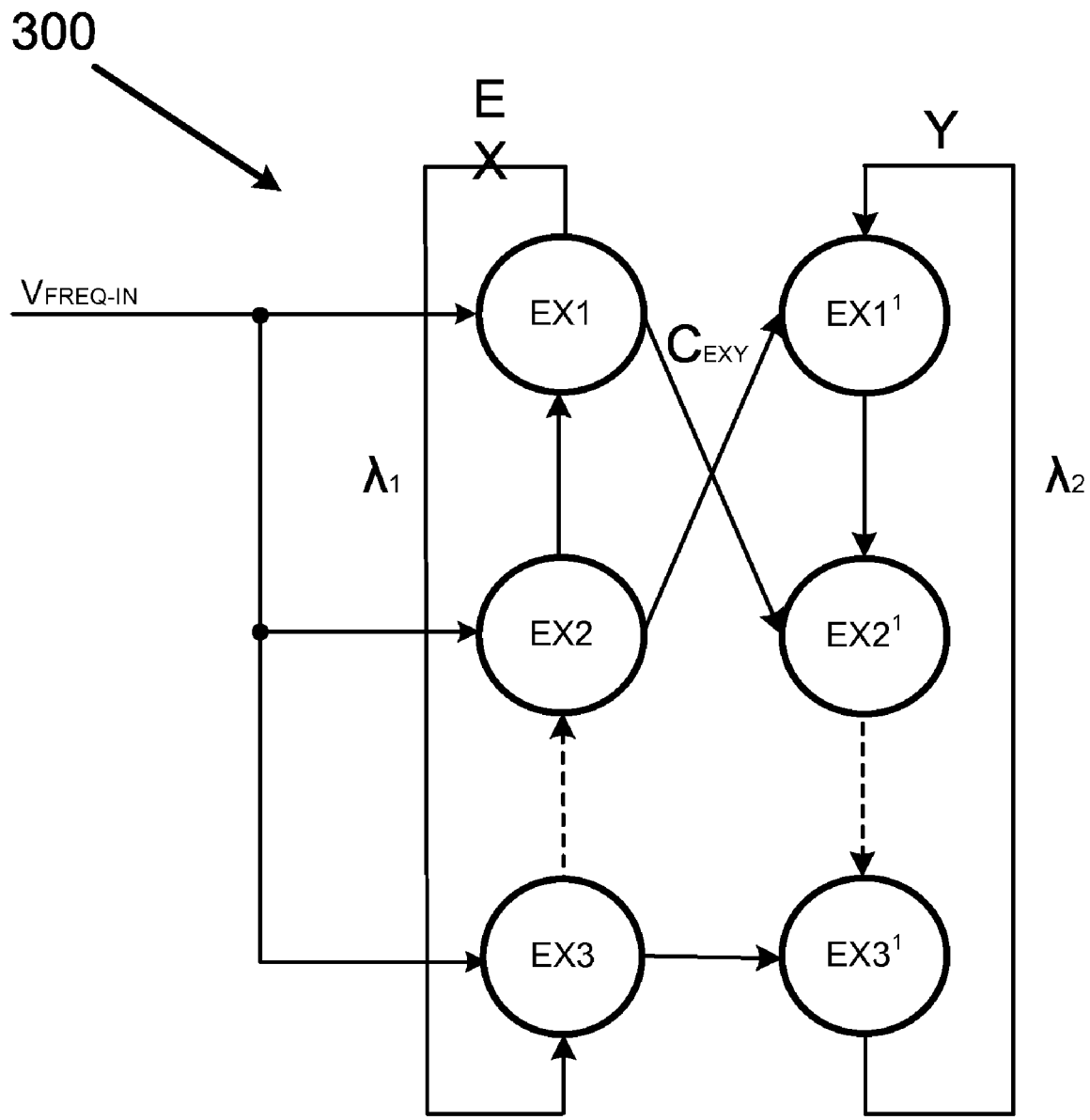
FIG. 3 depicts a second exemplary frequency conversion circuit.

FIG. 3 depicts a network 300 of two coupled arrays similar to that of FIG. 1, except for the cross-coupling scheme. This network 300 also affords various frequency down-conversion ratios that may be deduced by those skilled in the art using the approach outlined above, but not formally analyzed in this disclosure.

SIMULATIONS: To verify the existence of these oscillations, one can define the individual dynamics of each cell to be that of a prototypical bistable system, such as an overdamped Duffing oscillator with internal dynamics given by $f(x)=ax-bx^3$ and the (unidirectional) intra-array coupling functions by $h(x_i, x_{i+1})=x_i-x_{i+1}$, and $h(y_i, y_{i,1})=y_i-y_{i-1}$, respectively. Assuming that the inter-array connections are unidirectional as shown in FIG. 1, the $X_1$-array dynamics may have no dependence on the $X_2$-array dynamics. Then, the network dynamics can be represented by the system:

$$\tau \dot{x}_i = ax_i - bx_i^3 + \lambda_1(x_i - x_{i+1})$$

$$\tau \dot{y}_i = ay_i - by_i^3 + \lambda_2(y_i - y_{i-1}) + c_{xy}x_i, \qquad \text{Eq. (9)}$$

where i=1, . . . , N mod N, a and b are positive constants that describe the dynamics of the individual cells, $\lambda_1$ and $\lambda_2$ define the intra-array coupling strengths for the $X_1$ and $X_2$ arrays, respectively, with $c_{xy}$ being the inter-array coupling coefficient and τ being a system time constant.

Figure 4:
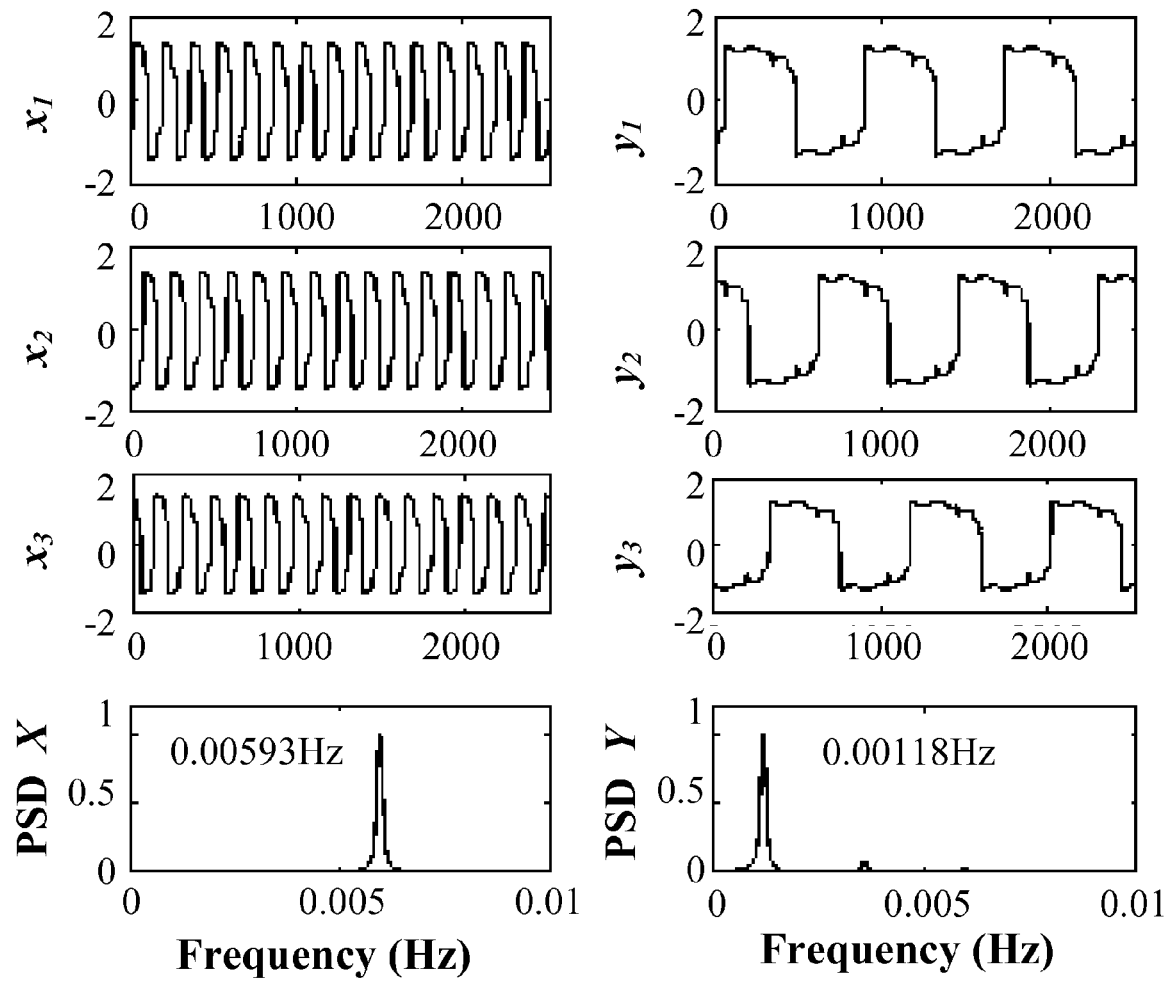
FIG. 4 depicts the transfer functions of the various stages of the frequency conversion circuit of FIG. 1, as well as a power spectral density.

First assume that there is no cross coupling, i.e., $c_{xy}$=0. Then, $\lambda_c$=a/2 is the critical coupling strength beyond which the $X_1$ elements oscillate. Accordingly, if the coupling strength of the $X_2$ array is below the critical coupling strength, i.e., $\lambda_2 < \lambda_c$, and the coupling strength of the $X_1$ array is above $\lambda_1 > \lambda_c$, then one can obtain the pattern shown in the left panel of FIG. 4 for the $X_1$ elements, but the $X_2$ array would be quiescent. FIG. 4 depicts numerical simulations showing the frequency down-conversion effect where by each element in the $X_2$-array oscillates at 1=5 the frequency of each element in the $X_1$-array (0:001186 Hz≈(⅕)0:00593 Hz). Parameters are: $c_{xy}$=0.14, $\lambda_1$=0:51, $\lambda_2$=0:3, a=1, b=1, and τ=1.

Continuing, increasing the cross-coupling strength $c_{xy}$>0 induces the $X_2$-array to oscillate (above a critical value of $c_{xy}$) with frequency ωx$_2$=ωx$_1$/5, which is shown in the right panel of FIG. 4.

Increasing further the cross coupling $c_{xy}$ causes the $X_2$ array to oscillate at 1=2 the frequency of the $X_1$-array. Additional frequency down-conversion ratios, (1/2, 1/5, 1/(3k–1)), where k=1, 2, 3, . . . are also observed as the cross-coupling, $c_{xy}$, increases further.

THE CASE OF A TIME-SINUSOIDAL INCIDENT SIGNAL: So far, emergent oscillations have been considered for the frequency down-conversion resulting from the intra-array coupling depicted in FIG. 1 in the absence of an external signal. The oscillations emerge when the control parameters (the coupling coefficients) push the system through a critical point it being assumed, always, that all the elements had random initial conditions (as in any reasonable experiment). As in the previous example (for the M=1 case), the emergent oscillations in each cell of the array are non-sinusoidal, have a well-defined phase difference (between cells) and the frequency shows a characteristic scaling behavior with the control parameter(s), in this case the coupling coefficients.

The above considerations allow one to follow a discussion of the down-conversion effect when an external sinusoidal signal ε sin ωt is applied to the $X_1$-array. The network equations can be then augmented by the term ε sin ωt on the rhs of the $x_i$ dynamics.

Intuitively, one may be led to believe that, because of the unidirectional inter-array coupling, the above considerations (specifically, the frequency down-conversion ratios for ωx$_2$/ωx$_1$) still hold true once the response of the X-array is known as the frequency can be down-converted through a suitable choice of the coupling parameters $\lambda_2$ and $c_{xy}$. Numerical simulations indicate that this is, indeed, the case although additional frequency entrainment between the external signal and the oscillations of the $X_1$-array must be taken into consideration.

The response of the $X_1$-array to the external signal has been quantified in for a different (soft-potential) coupled system. It is shown (FIG. 5) that, depending on the parameters ε and $\lambda_1$, the frequency ωx$_1$ of each element in the $X_1$-array can be entrained to ω/n with n being a positive integer. Then, given the frequency ωx$_1$, the response of the $X_2$-array can be activated by setting $c_{xy}$>0 and the frequency down-conversion ratios already obtained above are now applied to, in essence, the external frequency ω. As an example, consider the case of the $X_1$-array entrained to the frequency ωx$_1$=ω=3 (corresponding to the region II in FIG. 6). When the cross coupling is activated to $c_{xy}$=0.14, one observes the ⅕ frequency down-conversion from the $X_1$-array and the effective frequency of the $X_2$-array is 1/15 the frequency of the applied periodic signal.

Figure 5:
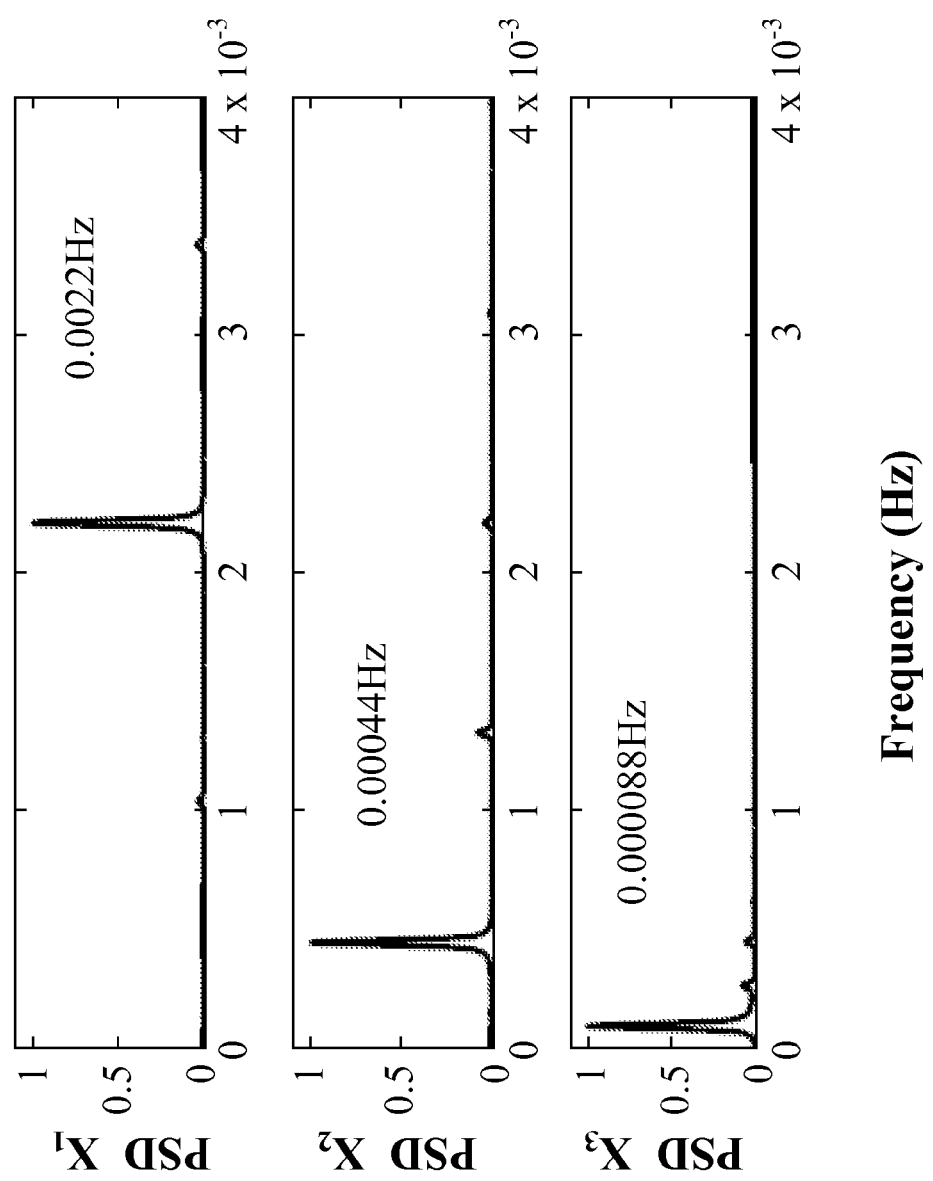
FIG. 5 depicts the power spectral density of the various stages of the frequency conversion circuit of FIG. 1.

FIG. 5 depicts the power spectral densities (PSDs) of a frequency down-conversion of an A/C signal to 1=75th of its original frequency via a network cascade of M=3 coupled arrays. The $X_1$-array receives the input signal with frequency f=0.0066 Hz, it then generates a TW pattern of oscillations with frequency f/3=0.0022 Hz. The $X_2$-array, in turn, down-converts the frequency of the TW pattern by a factor of 5. A third array, $X_3$, lowers even more the frequency of the TW pattern to f/75=0.000088 Hz.

One may expect that extending our results to a cascade of coupled networks (M>2) with each array down-converting the frequency of the preceding array via the rules already described above should be readily possible. In fact, a network of multiple arrays can achieve a lowering of frequencies in each successive array. A mathematical representation of the network is given by the following system of ODEs:

$$\dot{x}_{1i} = ax_{1i} - bx_{1i}^3 + \lambda_1(x_{1i} - x_{1(i+1)}) + \varepsilon \sin(\omega t) \qquad \text{Eq. (10)}$$

$$\dot{x}_{2i} = ax_{2i} - bx_{2i}^3 + \lambda_2(x_{2i} - x_{2(i-1)}) + c_{12}x_{1i}$$

$$\vdots = \vdots$$

$$\dot{x}_{Mi} = ax_{Mi} - bx_{Mi}^3 + \lambda_m\left(x_{Mi} - x_{M(i-(-1)M)}\right) + c_{(M-1)M}x_{(M-1)i},$$

where i=1, . . . , N mod N, $\lambda_j$ corresponds to the coupling of array j, for j=1, . . . , M, $c_{xjl}$ denotes the coupling from array j to array l, and M is the total number of arrays coupled together.

Again, notice that all the arrays are coupled unidirectionally from one to another, and the elements within each individual array are also unidirectionally coupled, but the direction of coupling alternates from one array to the next, i.e. from clockwise to counter-clockwise and so on. This pattern of coupling has been chosen so that the bifurcations can assure that the multi-frequency patterns are still present in the network.

As an example, let N=3, M=3, so that oscillations in the $X_1$ array occur only when $\lambda_1$>a/2=0:5. The existence of multi-frequency patterns in each successive array (j>1) requires $\lambda_j$<0.5. Thus, by setting the intra-array coupling strengths to ($\lambda_1$, $\lambda_2$, $\lambda_3$)=(0.51; 0.3; 0.3) and the cross coupling to ($c_{X12}$; $c_{X23}$)=(0.14; 0.14), one may achieve a down-converting of frequency from the $X_1$-array to the $X_2$-array, and again from the $X_2$-array to the $X_3$-array.

Figure 6:
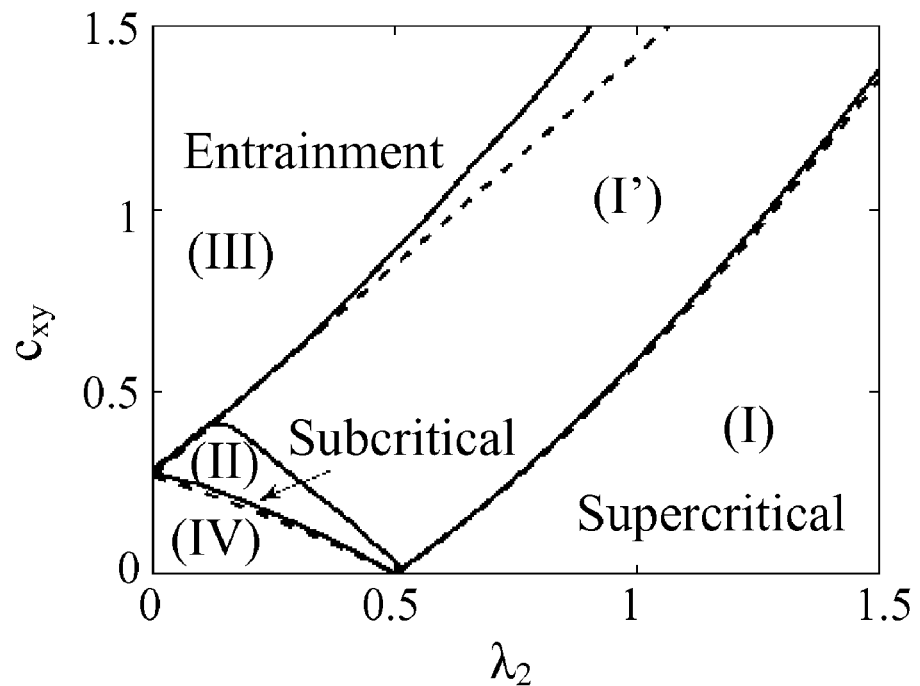
FIG. 6 depicts various operable regimes for a non-linear element.

Again, when the cross coupling ($c_{12}$, $c_{23}$) is turned off, or set below the critical values, the elements in the $X_2$- and $X_3$-arrays are quiescent. Thus, one may conclude that the oscillations emerge directly from the cross coupling terms. As seen in FIG. 6, the choice of parameters leads to ωx$_1$/ωx$_2$=5=ωx$_2$/ωx$_3$, so that a signal of frequency ω which causes the $X_1$-array elements to entrain at frequency ωx$_1$=ω/3 is, finally, down-converted to ωx$_3$=ω/75 at the output of the $X_3$ array.

Figure 7:
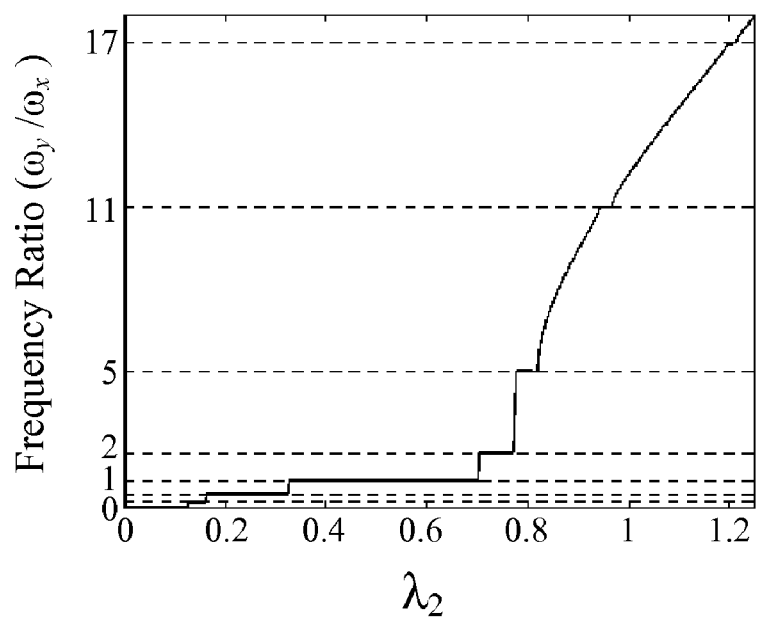
FIG. 7 depicts various frequency ratios for various disclosed frequency dividing arrays.

BIFURCATION ANALYSIS: In order to quantify the actual mechanisms for the existence and stability of the various frequency down-conversion patterns, we now carry out a bifurcation analysis, employing a numerical computation package. Consider, for clarity, the case N=3, M=2, although the analysis can be readily extended to larger networks as well as networks with different inter-array coupling patterns. Holding λ1 fixed past the critical value λc (=a/2) that can be required for the X1-array to oscillate, the two-parameter bifurcation diagram (solid curves) shown in FIG. 7 are obtained. FIG. 7 depicts regimes of frequency relations between the two coupled arrays, X1 and X2, of the network of overdamped Duffing elements shown in FIG. 1. The Solid curves are obtained numerically while the dashed curves are computed analytically.

Five distinct regimes are depicted in FIG. 4, including:

Regime (I), Supercritical regime: both arrays oscillate in a TW pattern. Note that as $\lambda_2$ increases, the frequency of the $X_2$-array ($\omega x_2$) can lock during certain intervals of $\lambda_2$, onto various sub-multiples of the frequency of the $X_1$-array ($\omega x_1$) i.e., $\omega x_2 = \omega x_1/m$, where m=2; 5; 11; 17; 23. FIG. 7 illustrates the actual intervals of frequency locking.

Regime (I'), Two in-phase regime: wherein two oscillatory units (of each array) share the same phase and same amplitude, but the third one is out of phase by ¼.

Figure 8:
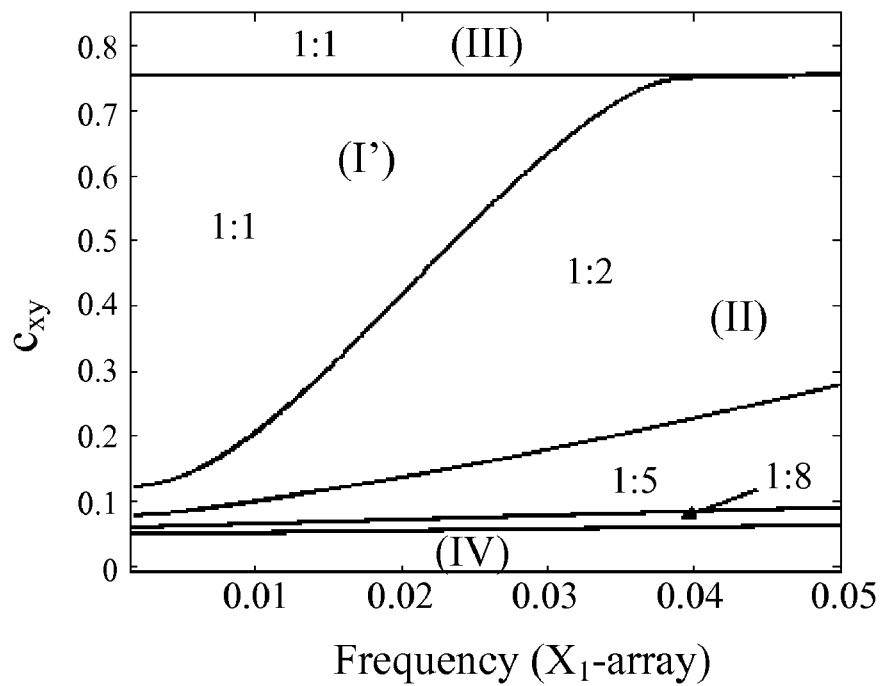
FIGS. 8 and 9 depict various frequency down-conversion rates.

Regime (II), Subcritical regime: frequency down-conversion by 1=2; 1=5, ..., 1/(3k−1) (where k=1, 2, 3 ...) of the frequency of the $X_1$-array. By setting the $X_2$-array coupling below the critical coupling ($\lambda_2$=0.4<$\lambda_c$) and varying the frequency of the $X_1$-array, the frequency down-conversion rates form a well-defined partition of the $c_{xy}$-Frequency ($X_1$) plane, as is shown in FIG. 8. The size of each partition seems to get smaller as the frequency down-conversion rate increases, in a manner that is reminiscent of the well-known Arnold's tongues.

Regime (III), Entrainment regime: frequency locking of each individual $y_i$ element to its corresponding $x_i$ element.

Regime (IV), no oscillations regime: oscillations do not exist and the system settles, instead, to a steady state. Note that the boundary curve that separates region II from I' is not an actual bifurcation curve. Moving from region II to I' does not change the characteristics (frequency and amplitude) of the oscillations, rather, only the phase of the TW pattern found in region II changes, with two of the units entraining their phases while the third unit oscillates out of phase by ¼. We show this boundary curve for completeness purposes, however. For larger values of the coupling strength in the $X_2$-array, i.e., past the critical coupling, the partition of frequency down-conversion rates changes as it can be observed in FIG. 9.

Figure 9:
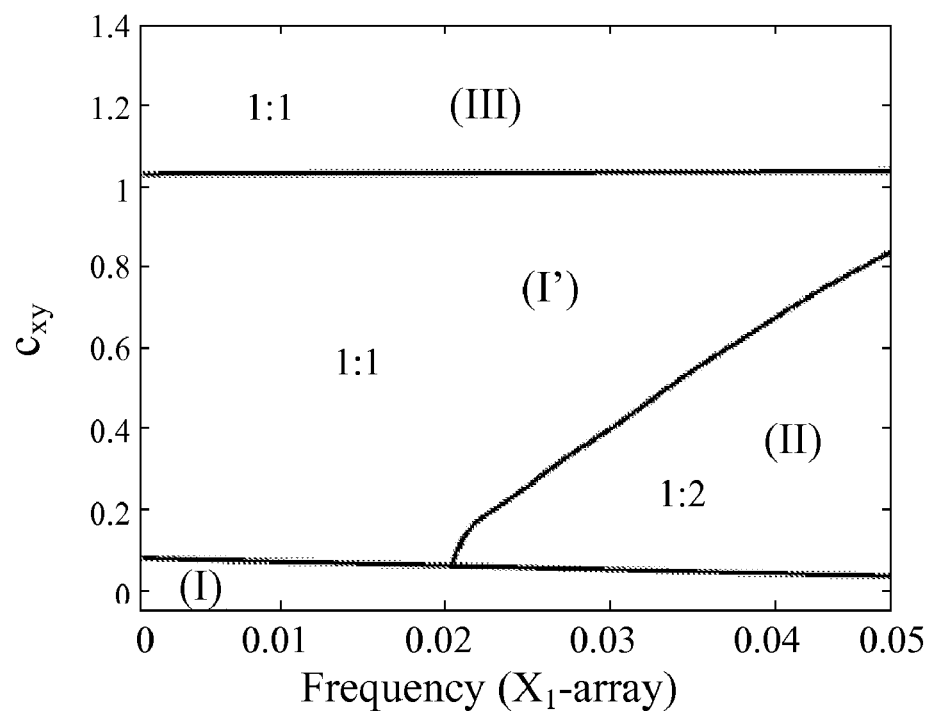

Note that FIG. 8 depicts the partition of frequency down-conversion rates, in the $c_{xy}$-Frequency ($X_1$) plane, between the $X_1$ and $X_2$-arrays. Coupling strength of the $X_2$-array is set below the critical coupling $\lambda_2$=0:4. FIG. 9 depicts the partition of frequency down-conversion rates similar to those of FIG. 8 except that the coupling strength is now $\lambda_2$=0:6, which is above the critical coupling of the $X_2$-array.

Continuing, one can compute an analytical expression for the critical cross coupling $c_{xy}$, curves shown in FIG. 8 (solid curves). From numerical simulations we know that, at the onset of the oscillations in the $X_2$-array, only one element ($y_1$, say) changes while the other can remain in an upper or lower state $y_{2m}$ (i.e., the elements evolve in sequence); in previous work $y_{2m}$ was found to be ($\tau$=1 for simplicity):

$$y_{2m} = \sqrt{\frac{a+2\lambda_2}{b} + \frac{c_{xy}}{2(a+2\lambda_2)}}. \quad \text{Eq. (11)}$$

The $X_1$ array exhibits similar behavior except that the amplitude of the applied AC signal replaces the cross-coupling term:

$$x_{1m} = \sqrt{\frac{a+2\lambda_1}{b} + \frac{\varepsilon}{2(a+2\lambda_1)}}. \quad \text{Eq. (12)}$$

Using Eqs. (11) and (12), the evolution of $y_1$ (from Eq. (8)) can be given by $$\dot{y}_1 = (a+\lambda_2)y_1 - by_1^3 + \lambda_2(y_{2m}) + c_{xy}x_{1m}. \quad \text{Eq. (13)}$$

Then, one can arrive at the following expression for the critical amplitude:

$$c_{xy}^c x_{1m} = (F_0 - \lambda_{2y2m}) + k_1\omega^2\left[(c_{xy}^c x_{1m})^2 - (F_0 - \lambda_{y2m}^2)^2\right]^{1/3}, \quad \text{Eq. (14)}$$

where $F_0 = \sqrt{4(a+\bar{e}2)3/(27b)}$, $\omega$ is the frequency of the applied AC signal, and $k_1$ is a fitting parameter. The three roots for $c_{xy}^c$ in Eq. (14) are $$c_{xy}^c = \frac{F_0 - \lambda_2 e}{(1+\lambda_2 f)x_{1m}} \quad \text{Eq. (15)}$$

$$c_{xy}^c = \frac{1}{x_{1m}}\left[\frac{2(F_0 - \lambda_2 e)(1+\lambda_2 f) + k_1^3(1-\lambda_2 f)\omega^2}{2(1+\lambda_2 f)^2}\right.$$

$$\left.\pm \frac{\sqrt{k_1^3\omega^2[8(F_0-\lambda_2 e)(1+\lambda_2 f) - k_1^3\omega^2(1-\lambda_2 f)]}}{2(1+\lambda_2 f)^2}\right],$$

where $e=\sqrt{4(a+2\lambda)/b}$ and $f=1/(2(a+2\lambda_2))$.

The first root represents the separation between the non-oscillating regime IV and the multi-frequency region II. The positive of the two conjugate roots defines the boundary between the supercritical regime I and the two in-phase regime I'. Since the coupling constant cannot be imaginary, one obtains a lower bound for the fitting parameter $k_1$, which is given by $$k_1 \geq \frac{2[(\lambda_2 e - F_0)(1+\lambda_2 f)]^{1/3}}{(\lambda_2 f - 1)^{2/3}\omega^{2/3}} \equiv 2\beta. \quad \text{Eq. (16)}$$

Next, there is a curve that separates the entrainment region III from the subcritical region II. The analytical expression $$c_{xy} = \frac{4a^3}{27(a+2\lambda_1)} + \lambda_2\sqrt{\frac{4a}{3b}}, \quad \text{Eq. (17)}$$

was found by transforming the governing equations for the $X_2$-array into polar coordinates. The analytically obtained boundary curves, with $k_1$=3.8$\beta$, are shown (dashed curves) on FIG. 7.

Figure 10:
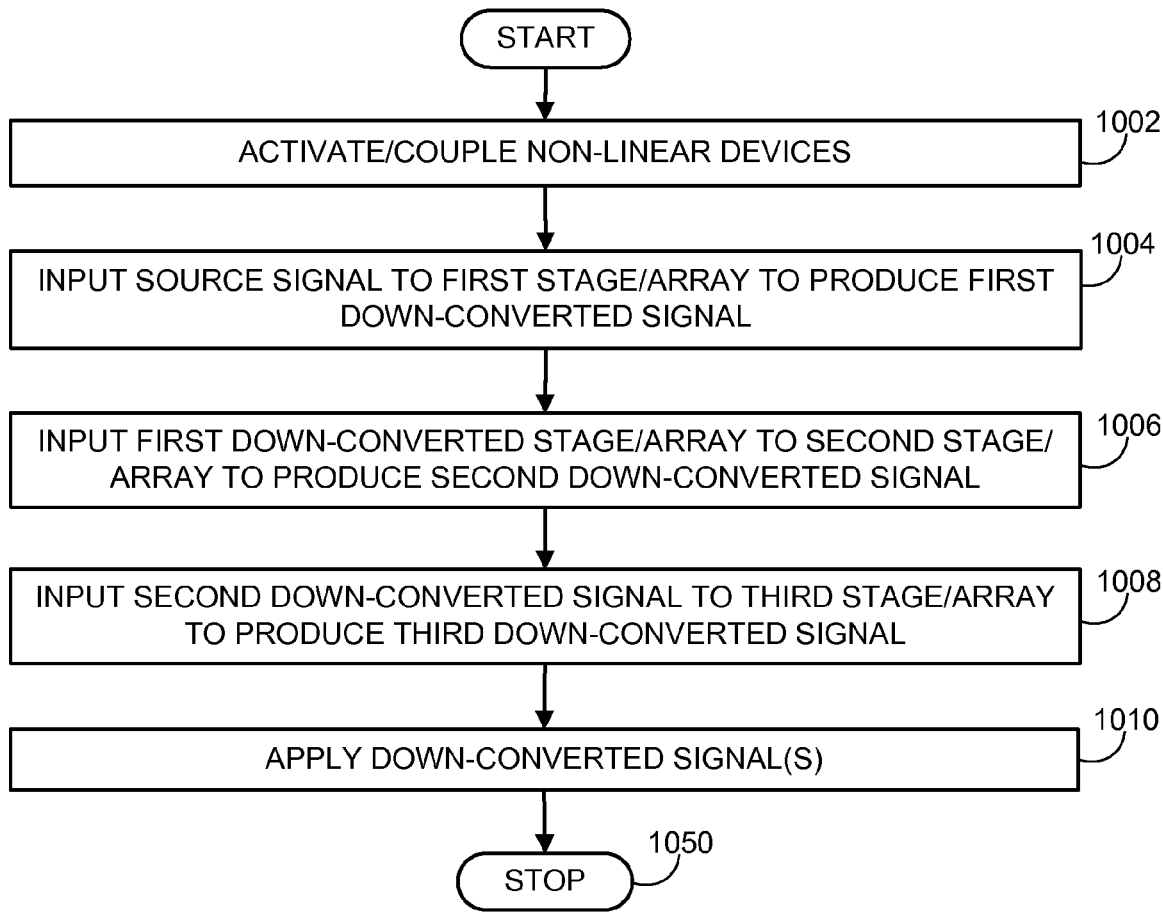
FIG. 10 is a flowchart outlining an exemplary operation of the present disclosure.

FIG. 10 is a flowchart outlining an exemplary operation. The process starts in step 1002 where various non-linear elements, such as those shown in FIGS. 2 and 3, are coupled in arrays of N elements to form Duffing oscillators, and M arrays of such Duffing oscillators are cross-coupled as shown in FIG. 1. As discussed above, suitable coupling must be provided between elements.

In step 1004, an input frequency source can be provided to a first stage/array (such as the left-hand stage/array of FIG. 1), and a first down-converted signal can be produced.

In step 1006, the first down-converted signal can be provided to a second stage/array (such as the middle stage/array of FIG. 1), and a second down-converted signal can be produced.

In step 1008, the second down-converted signal can be provided to a third stage/array (such as the right-hand stage/array of FIG. 1), and a third down-converted signal can be produced. Note that the concept of steps 1104-1108 can be repeated indefinitely, but is truncated at three stages/arrays in the present example for brevity. Next, in step 1010, any or all of the down-converted signals may be converted for use, and control continues to step 1050 where the process stops.

In various embodiments where the above-described systems and/or methods are implemented using a programmable device, such as a computer-based system or programmable logic, it should be appreciated that the above-described systems and methods can be implemented using any of various known or later developed programming languages, such as "C", "C++", "FORTRAN", Pascal", "VHDL" and the like.

Accordingly, various storage media, such as magnetic computer disks, optical disks, electronic memories and the like, can be prepared that can contain information that can direct a device, such as a computer, to implement the above-described systems and/or methods. Once an appropriate device has access to the information and programs contained on the storage media, the storage media can provide the information and programs to the device, thus enabling the device to perform the above-described systems and/or methods.

For example, if a computer disk containing appropriate materials, such as a source file, an object file, an executable file or the like, were provided to a computer, the computer could receive the information, appropriately configure itself and perform the functions of the various systems and methods outlined in the diagrams and flowcharts above to implement the various functions. That is, the computer could receive various portions of information from the disk relating to different elements of the above-described systems and/or methods, implement the individual systems and/or methods and coordinate the functions of the individual systems and/or methods related to communications.

What has been described above includes examples of one or more embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A frequency down-converting apparatus comprising:

a first array of N nonlinear, over-damped, bi-stable elements unidirectionally-coupled from element to element, wherein N is an odd integer greater than 1, and wherein each element of the first array is disposed to receive a first signal and to output a second signal having a lower frequency than the first signal;

a second array of N over-damped, bi-stable elements unidirectionally-coupled from element to element, wherein each element of the second array is further unidirectionally-coupled to a corresponding element in the first array such that each element of the second array is disposed to convert the second signal into a third signal having a frequency lower than the second signal; and wherein the second array of N over-damped, bi-stable elements is unidirectionally-coupled in an opposite path than for the first array.

2. The apparatus of claim 1, wherein the first array comprises 3 over-damped, bi-stable elements; and wherein the first element of the first array is further coupled to the second element of the second array via a first control path, the second element of the first array is further coupled to the first element of the second array via a second control path, and the third elements of the first and second arrays are coupled together via a third control path.

3. A frequency down-converting apparatus comprising:

a first array of N nonlinear, over-damped, bi-stable elements unidirectionally-coupled from element to element, wherein N is an odd integer greater than 1, and wherein each element of the first array is disposed to receive a first signal and to output a second signal having a lower frequency than the first signal;

a second array of N over-damped, bi-stable elements unidirectionally-coupled from element to element, wherein each element of the second array is further unidirectionally-coupled to a corresponding element in the first array such that each element of the second array is disposed to convert the second signal into a third signal having a frequency lower than the second signal; and a third array of N over-damped, bi-stable elements unidirectionally-coupled from element to element, wherein each element of the third array is further coupled to a respective element of the second array via a respective control path.

4. The apparatus of claim 3, wherein the second array of N over-damped, bi-stable elements is unidirectionally-coupled in an opposite path than for the first array.

5. The apparatus of claim 4, wherein the third array of N over-damped, bi-stable elements is unidirectionally-coupled in an opposite path than for the second array.

6. A frequency down-converting method comprising:

passing a first signal through a cascade of one or more arrays of unidirectionally coupled over-damped bi-stable elements wherein the frequency of the first signal is incrementally reduced upon passing through each successive array in the cascade; and wherein at least one array is unidirectionally-coupled in an opposite path than for a previous array.

7. A frequency down-converter comprising:

a network of M cascaded arrays, each array comprising N non-linear, over-damped, bi-stable elements uni-directionally-coupled from element to element in a ring such that, in the absence of an external signal, the ring of elements oscillates due to the coupling, wherein N is an odd integer greater than 1;

wherein the elements of the first array are disposed to receive an analog incoming signal and all the elements are disposed to create an analog output signal; and wherein the elements of array i+1 are disposed to receive the output signal from a corresponding element in array i, wherein i is an index;

wherein the dynamics of each element in array i is characterized by the equation $\dot{x}_i = f(x_i, \alpha) + \Sigma_{j \to i} \lambda_{ij} h(y_i, x_i)$, wherein $\dot{x}_i = (x_{i1}, \ldots, x_{ik}) \in R^k$ denotes the state variables of a given element in array i;

wherein the dynamics of each element in array i+1 is characterized by the equation $\dot{y}_i = f(y_i, \alpha) + \Sigma_{j \to i} \lambda_{ij} h(y_i, x_i) + c_{ij} k(y_i, x_i)$, wherein $\dot{y}_i = (y_{i1}, \ldots, y_{ik}) \in R^k$ denotes the state variables of a given element in array i+1; and where k is an inter-array coupling function, $c_{ij}$ is the corresponding coupling strength, the function h defines the coupling having strength $\lambda$ij between the given elements for the arrays i and i+1, and $\alpha \in R_p$ with Rp being a vector of the given element parameters.

8. The frequency down-converter of claim 7, wherein N equals 3.

9. The frequency down-converter of claim 8, wherein the frequency of the output signal of the elements in the first array is $\frac{1}{3}^{rd}$ the frequency of the incoming signal, the output signal of the elements in the second array is 1/(3m−1) the frequency of the incoming signal, and the output of the elements in the third array is 1/(3m−1) the frequency of the incoming signal, where m is a positive integer.

10. The frequency down-converter of claim 7, wherein each element comprises:
 a control terminal;
 an output terminal connected in series to the control terminal, wherein the output terminal is disposed to output the output signal;
 a buffer interposed between the control terminal and the output terminal;
 a circuit comprising an amplifier, a diode, a resistor, and a capacitor operatively coupled to one another, wherein the circuit is coupled to the element in parallel between the buffer and the output terminal;
 an input terminal coupled to the circuit; and
 wherein the input terminal is disposed to receive the output signal from a neighboring element in the same array, and wherein the control terminal is disposed to receive the output signal from a respective element in a neighboring array.

* * * * *